(12) United States Patent
Lyu et al.

(10) Patent No.: US 9,324,759 B2
(45) Date of Patent: Apr. 26, 2016

(54) IMAGE SENSOR PIXEL FOR HIGH DYNAMIC RANGE IMAGE SENSOR

(71) Applicant: OmniVision Technologies, Inc., Santa Clara, CA (US)

(72) Inventors: Jeong-Ho Lyu, San Jose, CA (US); Sohei Manabe, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 18 days.

(21) Appl. No.: 14/135,066

(22) Filed: Dec. 19, 2013

(65) Prior Publication Data

US 2015/0179695 A1 Jun. 25, 2015

(51) Int. Cl.
*H01L 31/103* (2006.01)
*H01L 31/107* (2006.01)
*H01L 27/146* (2006.01)

(52) U.S. Cl.
CPC ...... *H01L 27/14643* (2013.01); *H01L 27/1461* (2013.01); *H01L 27/14607* (2013.01); *H01L 27/14612* (2013.01); *H01L 27/14627* (2013.01)

(58) Field of Classification Search
CPC ............. H04N 5/35563; H04N 5/35554
USPC ........................................... 257/292
See application file for complete search history.

(56) References Cited

U.S. PATENT DOCUMENTS

| | | | |
|---|---|---|---|
| 7,525,077 B2 | 4/2009 | Kim et al. | |
| 7,863,647 B1* | 1/2011 | Veliadis | H01L 27/14609 257/186 |
| 2004/0207734 A1 | 10/2004 | Horiuchi | |
| 2006/0118837 A1* | 6/2006 | Choi | 257/292 |
| 2007/0141801 A1 | 6/2007 | Kwon et al. | |
| 2008/0017883 A1* | 1/2008 | Sarid | H01L 31/1075 257/186 |
| 2009/0002528 A1* | 1/2009 | Manabe | H04N 5/2355 348/248 |
| 2009/0200580 A1* | 8/2009 | Rhodes et al. | 257/233 |
| 2010/0102206 A1* | 4/2010 | Cazaux et al. | 250/208.1 |
| 2010/0277607 A1 | 11/2010 | Choi et al. | |
| 2010/0277623 A1 | 11/2010 | Tejada et al. | |
| 2010/0309333 A1 | 12/2010 | Smith et al. | |
| 2013/0076910 A1 | 3/2013 | Scott | |
| 2013/0242147 A1 | 9/2013 | Lee | |
| 2013/0258098 A1* | 10/2013 | Ikemoto | G01S 17/89 348/135 |
| 2014/0239154 A1 | 8/2014 | Chen et al. | |
| 2014/0246561 A1 | 9/2014 | Chen et al. | |
| 2015/0123172 A1 | 5/2015 | Chen et al. | |

OTHER PUBLICATIONS

U.S. Appl. No. 13/784,351, filed Mar. 4, 2013, Chen et al.
U.S. Appl. No. 14/070,286, filed Nov. 1, 2013, Chen et al.
ROC (Taiwan) Application No. 103111546, First Office Action and Search Report with English Translation, dated Jan. 14, 2016, (9 pages).

* cited by examiner

*Primary Examiner* — Andy Huynh
*Assistant Examiner* — Sitaramarao S Yechuri
(74) *Attorney, Agent, or Firm* — Blakely Sokoloff Taylor & Zafman LLP

(57) ABSTRACT

An image sensor pixel for use in a high dynamic range image sensor includes a first photodiode and a second photodiode. The first photodiode include a first doped region, a first lightly doped region, and a first highly doped region disposed between the first doped region and the first lightly doped region. The second photodiode has a second full well capacity substantially equal to a first full well capacity of the first photodiode. The second photodiode includes a second doped region, a second lightly doped region, and a second highly doped region disposed between the second doped region and the second lightly doped region. The first photodiode can be used to for measuring low light and the second photodiode can be used for measuring bright light.

7 Claims, 5 Drawing Sheets

IMAGE SENSOR PIXEL FOR HIGH DYNAMIC RANGE IMAGE SENSOR

TECHNICAL FIELD

This disclosure relates generally to image sensor, and in particular but not exclusively, relates to pixels in high dynamic range image sensors.

BACKGROUND INFORMATION

High dynamic range ("HDR") image sensors are useful for many applications. In general, ordinary image sensors, including for example charge coupled device ("CCD") and complementary metal oxide semiconductor ("CMOS") image sensors, have a dynamic range of approximately 70 dB dynamic range. In comparison, the human eye has a dynamic range of up to approximately 100 dB. There are a variety of situation in which an image sensor having an increased dynamic range is beneficial. For example, image sensors having a dynamic range of more than 100 dB are needed in the automotive industry in order to handle different driving conditions, such as driving from a dark tunnel into bright sunlight. Indeed, many applications may require image sensors with at least 90 dB of dynamic range or more to accommodate a wide range of lighting situations, varying from low light conditions to bright light conditions.

One known approach for implementing HDR image sensors is to use a combination pixel. One pixel can be used to sense bright light conditions while another pixel can be used to sense low light conditions. However, this approach usually includes physical and electrical difference between different photodiodes in the pixels. These differences can create challenges in processing the image signals generated from the different photodiodes. As a consequence, more complicated and less efficient read out and measuring electronics may need to be selected to read out the different photodiodes at the desired accuracy.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an imaging system and image pixels for an imaging system are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
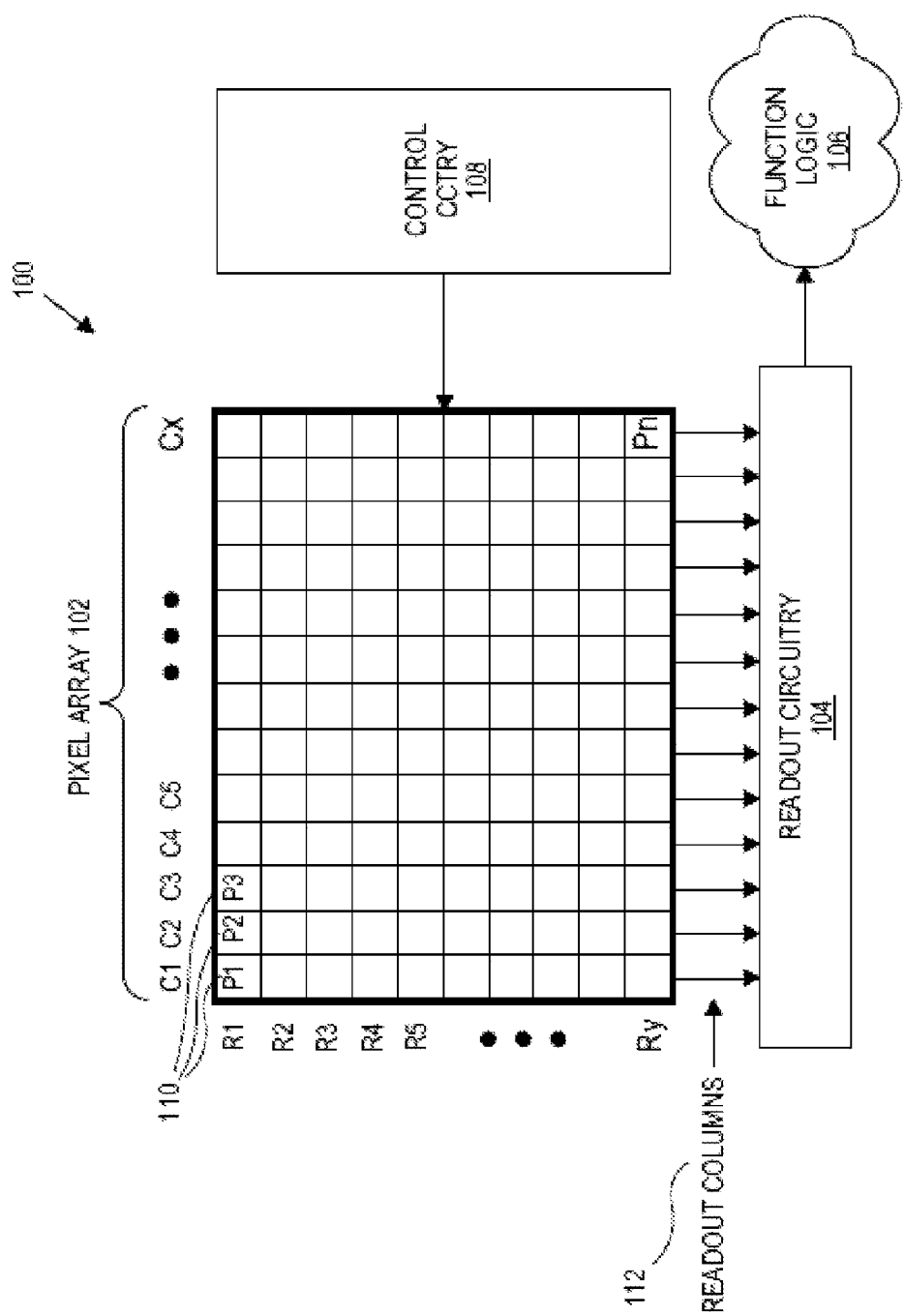
FIG. 1 is a block diagram schematic illustrating one example of an HDR imaging system, in accordance with an embodiment of the disclosure.

FIG. 1 is a block diagram schematic illustrating one example of an HDR imaging system 100, in accordance with an embodiment of the disclosure. HDR imaging system 100 includes an example pixel array 102, control circuitry 108, readout circuitry 104, and function logic 106. As shown in the depicted example, HDR imaging system 100 includes pixel array 102 which is coupled to control circuitry 108 and readout circuitry 104. Readout circuitry 104 is coupled to function logic 106. Control circuitry 108 is coupled to pixel array 102 to control operational characteristics of pixel array 102 in order to capture images generated by image light received by pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

In one example, pixel array 102 is a two-dimensional (2D) array of imaging sensors or pixels 110 (e.g., pixels P1, P2 . . . , Pn). In one example, each pixel 110 is a CMOS imaging pixel including a first photodiode to capture low light data and a second photodiode to capture bright light data. As illustrated, each pixel 110 is arranged into a row (e.g., rows R1 to Ry) and a column (e.g., column C1 to Cx) to acquire image data of a person, place, object, etc., which can then be used to render an image of the person, place, object, etc.

In one example, after each pixel 110 has acquired its image data or image charge, the image data is read out by readout circuitry 104 through readout columns 112 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously. The image charge generated by a first photodiode (for low light) and a second photodiode (for bright light) of pixel 110 may be read out separately during different time periods.

Figure 2:
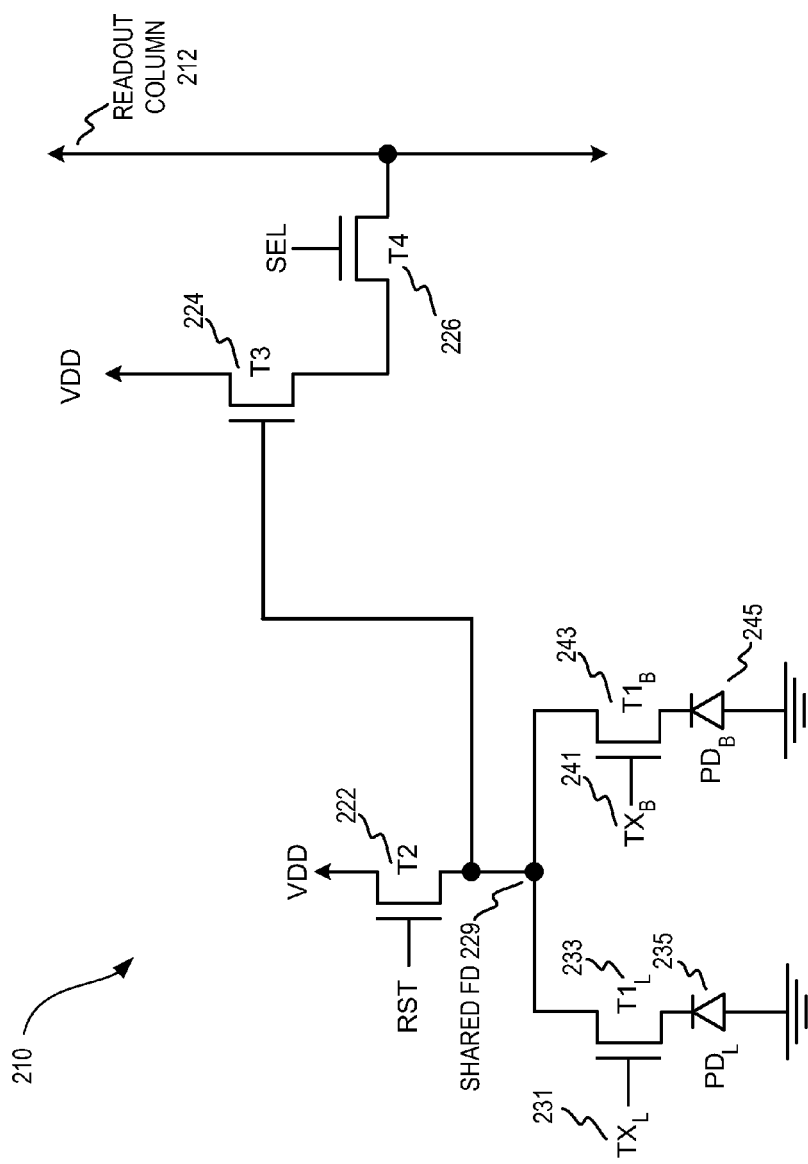
FIG. 2 is a schematic illustrating one example of an HDR pixel that can be implemented in the HDR image sensor illustrated in FIG. 1, in accordance with an embodiment of the disclosure.

FIG. 2 is a schematic illustrating one example of an HDR pixel 210 that can be implemented as pixel(s) 110 in HDR imaging system 100, in accordance with an embodiment of the disclosure. Pixel 210 includes a first photodiode 235 ($PD_L$) and a second photodiode 245 ($PD_B$). First photodiode 235 may be configured to measure low light data and second photodiode 245 may be configured to measure bright light data. Transfer transistor 233 ($T1_L$) is coupled between first photodiode 235 and shared floating diffusion 229 to transfer first image charge from the first photodiode 235 to shared floating diffusion 229. Transfer transistor 243 ($T1_B$) is coupled between first photodiode 235 and shared floating diffusion 229 to transfer second image charge from the second photodiode 245 to shared floating diffusion 229. Transfer transistor 233 ($T1_L$), transfer transistor 243 ($T1_B$), first photodiode 235, and second photodiode 245 are disposed in a semiconductor material (e.g. silicon), in one embodiment.

Image light incident on pixel 210 will generate image charge in each of the photodiodes 235 and 245. First image charge is generated in first photodiode 235 and second image charge is generated in second photodiode 245. When transfer transistor 233 receives a first transfer signal $TX_L$ 231 at its transfer gate, the first image charge is transferred to shared floating diffusion region 229. When second transfer transistors 243 receives second transfer signal $TX_B$ 241 at its transfer gate, the second image charge from photodiode 245 is transferred to shared floating diffusion region 229. The gates of first transfer transistor 233 and second transfer transistor 243 are coupled to be activated (turned ON) separately. In other words, first transfer signal $TX_L$ 231 and second transfer signal $TX_B$ 241 can be separately asserted.

To capture an image, the first image charge that accumulates in first photodiode 235 is switched through transfer transistor 233 into shared floating diffusion region 229 in response to a control signal $TX_L$ 231 being received on a first transfer gate of transfer transistor 233. A first image signal (corresponding to the first charge transferred to shared floating diffusion 229) can then be amplified by amplifier transistor T3 224 and readout onto readout column 212 by activating row select transistor T4 226. In one example, amplifier transistor T3 224 is coupled in a source follower configuration as shown, which therefore amplifies the image signal at the gate terminal of amplifier transistor T3 224 to an output signal at the source terminal of amplifier transistor T3 224. As shown, row select transistor T4 226 is coupled to the source terminal of amplifier transistor T3 224 to selectively switch the output of amplifier transistor T3 224 to readout column 212 in response to a control signal SEL. As shown in the example, pixel 210 also includes reset transistor T2 222 coupled to shared floating diffusion region 229, which may be used to reset charge accumulated in pixel 210 in response to a reset signal RST. In one example, the charge in shared floating diffusion region 229 can be reset during an initialization period of pixel 210, or for example each time after charge information has been read out from pixel 210 and prior to accumulating charge in first photodiode 235 and second photodiode 245 for the acquisition of a new HDR image, in accordance with the embodiments of the disclosure.

Second image charge that accumulates in second photodiode 245 can be switched through transfer transistor 243 into shared floating diffusion region 229 in response to a control signal $TX_B$ 241 being received on a second transfer gate of second transfer transistor 243. A second image signal (corresponding to the second charge transferred to share floating diffusion 229) can be readout onto readout column 212 in a similar sequence as the first image signal so that a low light image signal/data can be readout from first photodiode 235 and a bright light image signal/data can be readout from second photodiode 245. Bright light image data and the low light image data from multiple pixels 210 in a pixel array (e.g. pixel array 102) can be combined to generate an HDR image. Image pixel 210 may be integrated into a frontside illuminated image sensor or a backside illuminated image sensor.

Figure 3A:
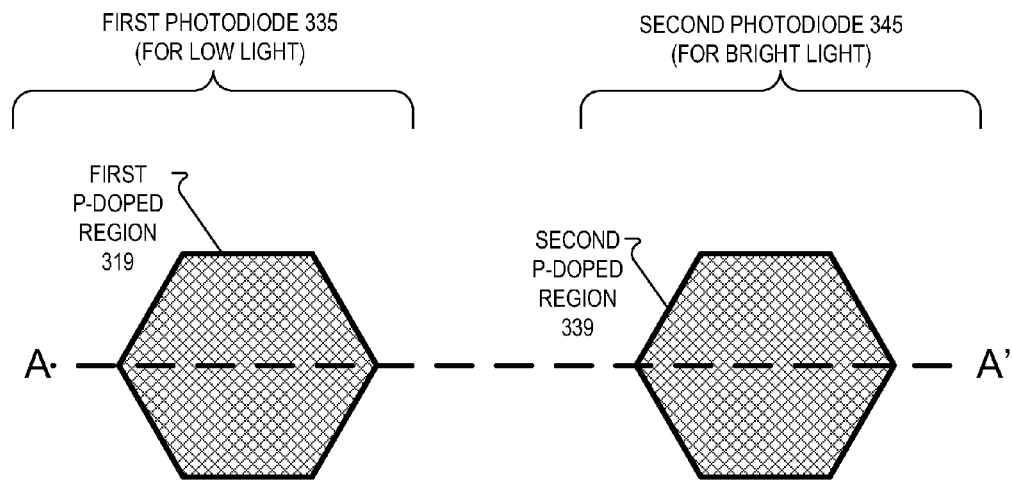
FIG. 3A is an illustration of a plan view of two photodiodes that can be used in an HDR pixel, in accordance with an embodiment of the disclosure.
Figure 3B:
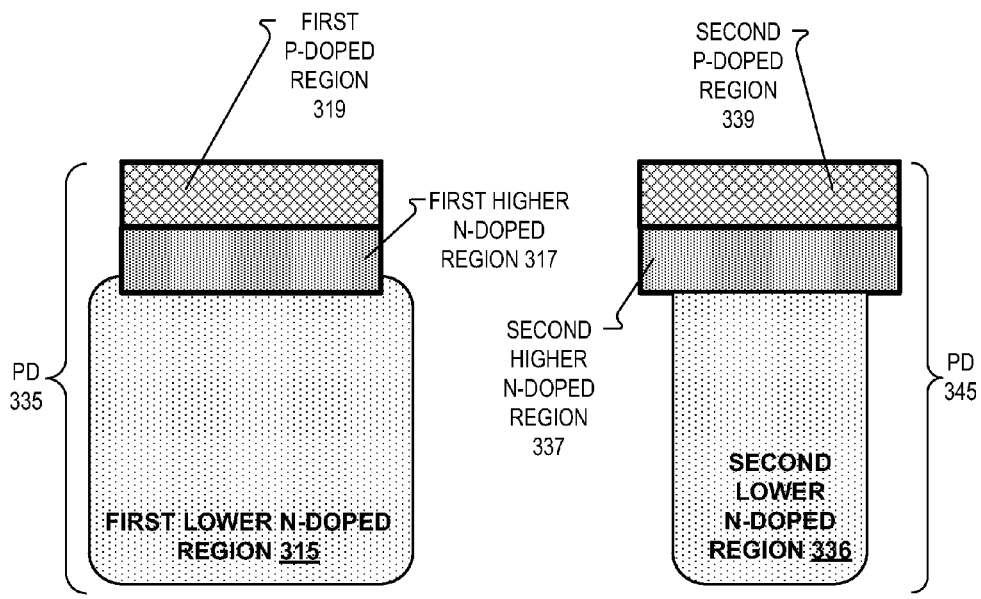
FIG. 3B is a cross section illustration of the two photodiodes in FIG. 3A, in accordance with an embodiment of the disclosure.

First photodiode 235 can be configured to capture low light and second photodiode 245 can be configured to capture bright light using different design schemes. FIG. 3A is an illustration of a plan view of a first photodiode 335 and a second photodiode 345 that can be used as photodiodes 235 and 245, respectively, in accordance with an embodiment of the disclosure. First photodiode 335 and second photodiode 345 are illustrated in order to illustrate aspects of the embodiments of the present disclosure, although in practice, photodiodes 335 and 345 may be arranged closer together. In FIG. 3A, first photodiode 335 includes a hexagonal first p-doped region 319. Second photodiode 345 includes second p-doped region 339, which is also illustrated as hexagonal, although different geometries are possible. FIG. 3B is a cross section illustration through line A-A' in FIG. 3A, in accordance with an embodiment of the disclosure. First photodiode 335 is disposed in a semiconductor substrate (not illustrated). In one example, the semiconductor substrate is silicon. First photodiode 335 includes a first p-doped region 319, a first higher n-doped region 317, and a first lower n-doped region 315. First higher n-doped region 317 is disposed between first p-doped region 319 and first lower n-doped region 315. First p-doped region 319 is doped opposite of n-doped region 317 and n-doped region 315 to form the diode of first photodiode 335. First higher n-doped region 317 has a higher dopant concentration than first lower n-doped region 315.

In FIG. 3B, second photodiode 345 is disposed in the same semiconductor substrate (not illustrated) as first photodiode 335. Second photodiode 345 includes a second p-doped region 339, a second higher n-doped region 337, and a second lower n-doped region 336. Second higher n-doped region 337 is disposed between second p-doped region 339 and second lower n-doped region 336. Second p-doped region 339 is doped opposite of n-doped region 337 and n-doped region 336 to form the diode of second photodiode 345. Second higher n-doped region 337 has a higher dopant concentration than second lower n-doped region 336. First lower n-doped region 315 may have the same dopant concentration as second lower n-doped region 336.

First higher n-doped region 317 and second higher n-doped region 337 have substantially equal dopant concentrations and are substantially the same size and shape. The full well capacity of photodiodes 335 and 345 is mostly set by the size and dopant concentrations of their higher doped regions 317 and 337. Therefore, since regions 317 and 337 have substantially the same size and dopant concentrations, the full well capacity of photodiode 335 is substantially equal to the full well capacity of second photodiode 345. Having both photodiodes have similar (if not equal) full well capacities allows for reduced complexity for signal processing.

Although both photodiode 335 and 345 have the same or similar full well capacities, first photodiode 335 is more sensitive to image light to capture low light image data while second photodiode 345 is configured to capture bright light image data and is less sensitive to image light than first photodiode 335. To accomplish this, first lower n-doped region 315 is larger than second lower n-doped region 336. In FIG. 3B, second lower n-doped region 336 is narrower than first lower n-doped region 315. As a result, photodiode 345 generates a smaller amount of image charge than photodiode 335, given the same amount of image light received by each photodiode. Consequently, first photodiode 335 is more sensitive than photodiode 345.

Figure 4A:
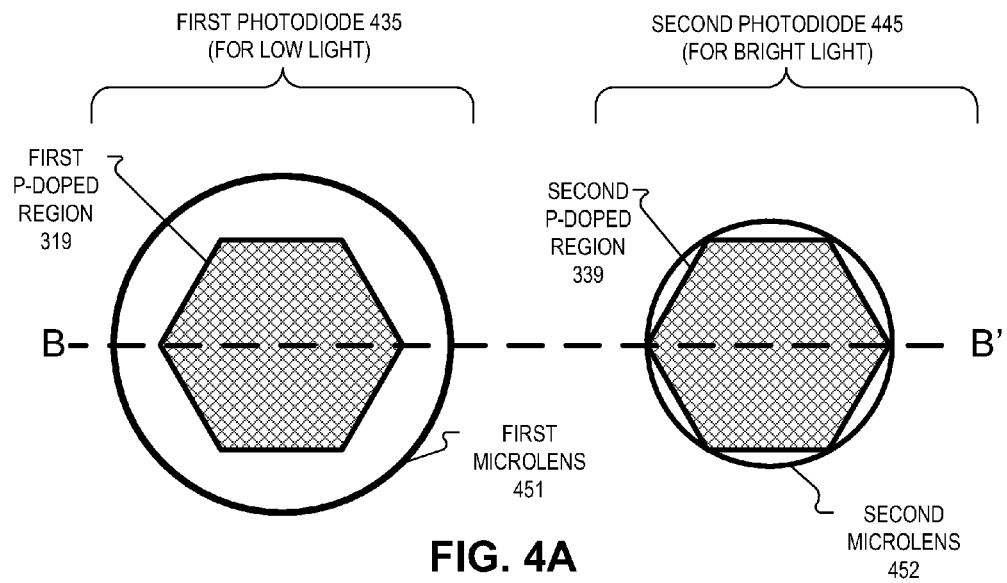
FIG. 4A is an illustration of a plan view of two photodiodes and two microlenses that can be used in an HDR pixel, in accordance with an embodiment of the disclosure.
Figure 4B:
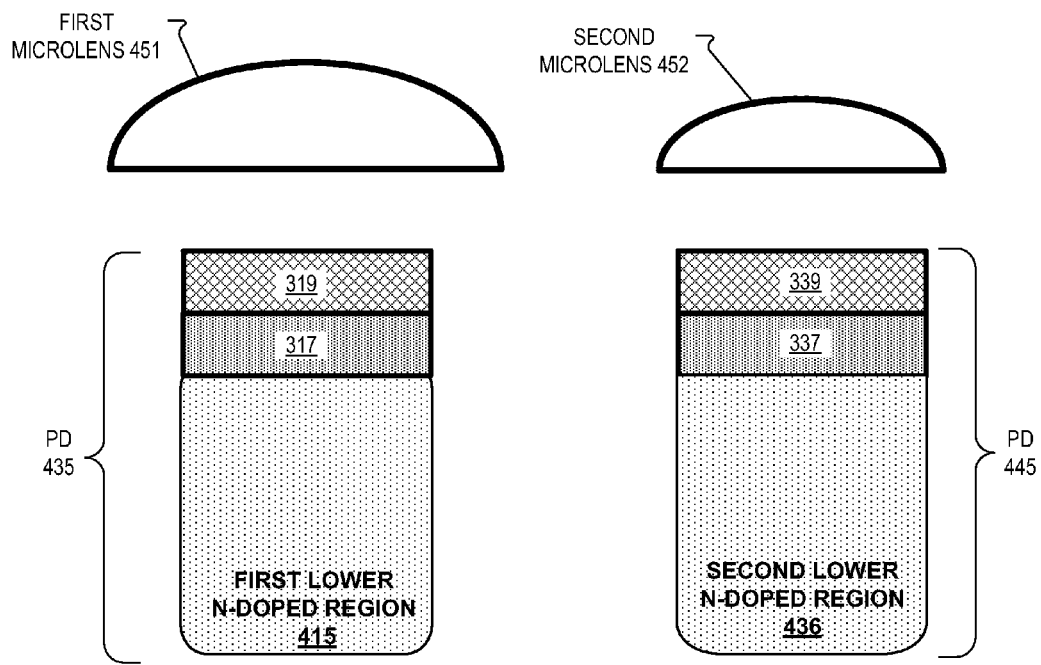
FIG. 4B is a cross section illustration of the two photodiodes and the two microlenses in FIG. 4A, in accordance with an embodiment of the disclosure.

FIG. 4A is an illustration of a plan view of a first photodiode 435 and a second photodiode 445 that can be used as photodiodes 235 and 245, respectively, in accordance with an embodiment of the disclosure. First photodiode 435 and second photodiode 445 are illustrated in order to illustrate aspects of the embodiments of the present disclosure, although in practice, photodiodes 435 and 445 may be arranged closer together. In FIG. 4A, first photodiode 435 includes first p-doped region 319 disposed under a first microlens 451. Second photodiode 445 includes second p-doped region 339 disposed under second microlens 452. FIG. 4B is a cross section illustration through line B-B' in FIG. 4A, in accordance with an embodiment of the disclosure. First photodiode 435 and second photodiode 445 are similar to photodiodes 335 and 445 except that the lower n-doped regions of the photodiodes are the same size. More specifically, first lower n-doped region 415 is the same width as second lower n-doped region 436, in FIG. 4B. First lower n-doped region 415 and second lower n-doped region 436 may also have the same light exposure area, where the light exposure area is defined as the surface area of regions 415 and 436 that would be encountered by rays of light propagating into the page in FIG. 4A. First higher n-doped region 317 has a greater dopant concentration than first lower n-doped region 415 and second higher n-doped region 337 has a greater dopant concentration than second lower n-doped region 436. First lower n-doped region 415 may have the same dopant concentration as second lower n-doped region 436.

Since photodiode 435 and 445 are substantially identical, they will have substantially the same electrical characteristics (including the same full well capacity), which will make readout and image processing simpler. However, since they have similar capabilities with regard to generating image charge from image light, a first microlens 451 is disposed over photodiode 435 to increase the amount of image light incident on photodiode 435. First microlens 451 is optically coupled to direct a first amount of image light to first photodiode 435, while second microlens 452 is optically coupled to direct a second amount of image light to second photodiode 445 that is less than the first amount. Directing more light into photodiode 435 effectively makes photodiode 435 better able to capture low light image data than photodiode 445.

Figure 5A:
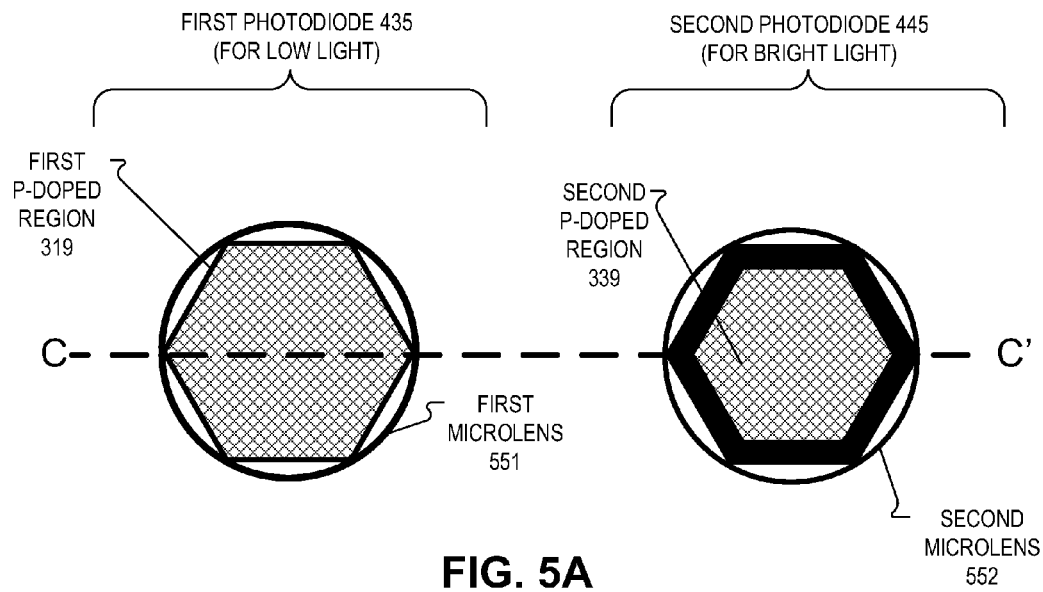
FIG. 5A is an illustration of a plan view of two photodiodes, two microlenses, and an aperture sizer that can be used in an HDR pixel, in accordance with an embodiment of the disclosure.
Figure 5B:
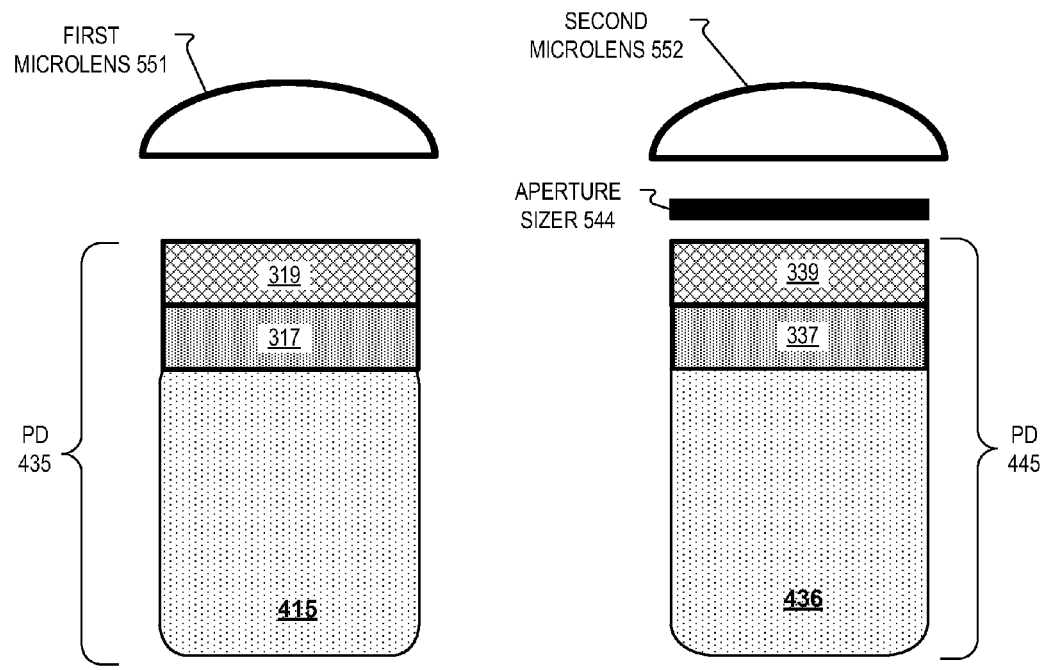
FIG. 5B is a cross section illustration of the two photodiodes, the two microlenses, and the aperture sizer in FIG. 5A, in accordance with an embodiment of the disclosure.

FIG. 5A is an illustration of a plan view of a first photodiode 435 and a second photodiode 445 disposed under first microlens 551 and second microlens 552, respectively, in accordance with an embodiment of the disclosure. In FIG. 5A, a hexagon-shaped aperture sizer 544 is disposed between p-doped region 339 and second microlens 552. FIG. 5B is a cross section illustration through line C-C' in FIG. 5A, in accordance with an embodiment of the disclosure. In FIGS. 5A and 5B, first microlens 551 is substantially identical to second microlens 552 and both are optically configured to direct the same amount of image light toward their respective photodiode. However, aperture sizer 544 limits the amount of image light that would propagate to photodiode 445, reducing the image charge generated in photodiode 445 and making first photodiode 435 comparatively better able to capture low light image data.

Those skilled in the art will understand that the embodiments in FIGS. 3A-5B may be combined, where applicable.

For example, the embodiment illustrated in FIGS. 4A and 4B could be modified by switching region 415 for region 315 and switching region 436 for 336. In this example, the first photodiode would be more sensitive to image light due to the larger lightly doped region and first microlens 451 would also direct more image light to the first photodiode making the first photodiode better suited to capture low light image data, while the second photodiode would comparably be better suited to capture bright light image data. Yet, the full well capacities of the first and second photodiodes would remain substantially the same, which allows for less complex image processing of the low light and bright light signals. Similarly, the embodiment illustrated in FIGS. 5A and 5B could be modified by switching region 415 for region 315 and switching region 436 for 336, which would make one photodiode more sensitive than the other, while retaining the substantially identical full well capacities of the photodiodes.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor pixel for use in a high dynamic range image sensor, the image sensor pixel comprising:
    a first photodiode disposed in a semiconductor material, the first photodiode including a first doped region, a first lightly doped region, and a first highly doped region disposed between the first doped region and the first lightly doped region, wherein the first doped region is doped opposite of the first lightly doped region and the first highly doped region, and wherein the first highly doped region has a higher first dopant concentration than the first lightly doped region, and wherein the first doped region is positioned to receive incident light before the first highly doped region receives the incident light; and
    a second photodiode disposed in the semiconductor material and having a second full well capacity substantially equal to a first full well capacity of the first photodiode, the second photodiode including a second doped region, a second lightly doped region having a narrower light exposure area than the first lightly doped region, and a second highly doped region disposed between the second doped region and the second lightly doped region, the second lightly doped region having a smaller cross-sectional area than the second highly doped region, wherein the second doped region is doped the same polarity as the first doped region but opposite of the second lightly doped region and the second highly doped region, and wherein the second highly doped region has a higher second dopant concentration than the second lightly doped region, the first highly doped region and the second highly doped region being substantially the same size and shape and having substantially equal dopant concentrations, and wherein the second doped region is positioned to receive the incident light before the second highly doped region receives the incident light.

2. The image sensor pixel of claim 1 further comprising:
a shared floating diffusion;
a first transfer transistor disposed in the semiconductor material to transfer first image charge from the first photodiode to the shared floating diffusion, wherein the first image charge is generated by image light incident on the first photodiode; and
a second transfer transistor disposed in the semiconductor material to transfer second image charge from the second photodiode to the shared floating diffusion, wherein the second image charge is generated by the image light incident on the second photodiode.

3. The image sensor pixel of claim 2, wherein the first transfer transistor and the second transfer transistor are coupled to be activated separately.

4. The image sensor pixel of claim 2 further comprising a reset transistor disposed in the semiconductor material and coupled to the shared floating diffusion.

5. The image sensor pixel of claim 2 further comprising:
an amplifier transistor disposed in the semiconductor material and coupled to amplify an image signal on the shared floating diffusion; and
a select transistor disposed in the semiconductor material between the amplifier transistor and a readout column line.

6. The image sensor pixel of claim 1, wherein the first photodiode has a greater sensitivity to image light than the second photodiode.

7. The image sensor pixel of claim 1, wherein the first lightly doped region has a larger cross-sectional area than the first highly doped region.

* * * * *